United States Patent
Kuge

(10) Patent No.: US 6,597,031 B2
(45) Date of Patent: Jul. 22, 2003

(54) OVONIC UNIFIED MEMORY DEVICE AND MAGNETIC RANDOM ACCESS MEMORY DEVICE

(75) Inventor: Shigehio Kuge, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/173,667

(22) Filed: Jun. 19, 2002

(65) Prior Publication Data

US 2003/0111679 A1 Jun. 19, 2003

(30) Foreign Application Priority Data

Dec. 18, 2001 (JP) .................................. 2001-384739

(51) Int. Cl.⁷ ............................................. H01L 31/119
(52) U.S. Cl. ....................................... 257/295; 257/296
(58) Field of Search .......................... 257/295, 4, 302, 257/296; 365/163, 175, 171; 483/3

(56) References Cited

U.S. PATENT DOCUMENTS

| | | | | |
|---|---|---|---|---|
| 6,015,977 A | * | 1/2000 | Zahorik | 257/4 |
| 6,339,544 B1 | * | 1/2002 | Chiang et al. | 365/163 |
| 6,391,658 B1 | * | 5/2002 | Gates et al. | 483/3 |
| 6,442,064 B1 | * | 8/2002 | Michijima et al. | 365/171 |
| 6,462,984 B1 | * | 10/2002 | Xu et al. | 365/175 |

FOREIGN PATENT DOCUMENTS

JP 11-505071 5/1999

OTHER PUBLICATIONS

U.S. patent application publication U.S. 2002/0140016 by Cha.*
U.S. patent application publication U.S. 2002/0175357 by Kim et al.*
Hiroki Eda, "Awake from the Sleep for 30 Years by the Achievement of Research on Optical Disk", NIKKEI Electronics (No. 789), Feb. 12, 2001, pp. 160–161.
M. Bauer et al., "A Multilevel–Cell 32 Mb Flash Memory", IEEE International Solid–State Circuits Conference Digest of Technical Papers, pp. 132–133, 1995.
M. Bauer et al., "A Multilevel–Cell 32 Mb Flash Memory", IEEE International Solid–State Circuits Conference Slide Supplement to the Digest of Technical Papers, pp. 98–99 and 306–307, 1995.
Terue Matsumoto, "New Memory "MRAM" Aiming at DRAM Substitute", NIKKEI Electronics (No. 757), Nov. 11, 1999, pp. 49–56.

* cited by examiner

Primary Examiner—David Nelms
Assistant Examiner—Thinh T. Nguyen
(74) Attorney, Agent, or Firm—McDermott, Will & Emery

(57) ABSTRACT

A semiconductor memory device capable of achieving high integration is provided. A semiconductor memory device is provided with: a silicon substrate; bipolar transistors formed on the silicon substrate; an interlayer insulating film which has contact holes accepting parts of the bipolar transistors and reaching a surface of the silicon substrate, and which is formed on the silicon substrate; and storage elements electrically connected to the bipolar transistors. The storage elements have a first state in which an electrical resistance is relatively high and a second state in which an electrical resistance is relatively low.

10 Claims, 15 Drawing Sheets

OVONIC UNIFIED MEMORY DEVICE AND MAGNETIC RANDOM ACCESS MEMORY DEVICE

BACKGROUND OF THE INVENTION

1. Field of the Invention

The present invention relates to a semiconductor memory device, and particularly, to an ovonic unified memory (OUM) or a magnetic random access memory (MRAM).

2. Description of the Background Art

In recent years, research and development have been proceeded with a new semiconductor memory device using a material employed in storage elements of a compact disk rewritable (CD-RW) or a digital versatile disk RAM (DVD-RAM) and so on. This semiconductor memory device employs a chalcogenide material (Ge—Sb—Te based material: chalcogenide alloy) as a memory cell. The chalcogenide material turns into two states; an amorphous state (a high resistivity state) and a polycrystalline state (a low resistivity state) by heating and relevant cooling. The material exhibits different electric resistance values in the two states; therefore, discrimination on "0" or "1" can be performed by reading the states.

In order to turn the chalcogenide material into the crystalline state, the material is kept at a temperature less than 600° C. for a period of the order of 10 ns. Thereafter, the material turns into a crystalline state by cooling. In order to turn the chalcogenide material into the amorphous state, the material is heated to a temperature of 600° C. or more and then to cool rapidly.

While in a case of CD-RW or the like, the heating is performed using a laser, in a case where the chalcogenide material is used, the heating of the material is performed by feeding a current through a heating element to cause a change in its state. Such a semiconductor memory device includes: a chalcogenide film as a memory element; a resistor for heating the film; and a transistor selecting a memory cell, and the memory cell is called an OUM.

While there are various kinds of OUMs, there has been known one using a junction transistor (or a bipolar transistor) as the select transistor. The bipolar transistor, generally, has been known as an element capable of a high speed operation. The use of the bipolar transistor makes it possible to feed a current in an instant for the purpose of heating the chalcogenide material or to shut off a current in an instant for the purpose of cooling the chalcogenide material.

A semiconductor memory device using a bipolar transistor as a select transistor is disclosed in, for example, National Patent Publication No. 11-505071. FIG. 26 is a sectional view of a conventional semiconductor memory device disclosed in the above-mentioned publication. Referring to FIG. 26, a memory cell 420 includes a lower layer 412. Lower layer 412 includes an access device such as a diode or a bipolar transistor.

An electrode material layer 434 is formed on lower layer 412. A protective film 416 is formed on electrode material layer 434. A cell aperture 418 is formed in protective film 416. A pillar 444 is formed inside cell aperture 418. A side spacer 448 and a protrusion 446 are provided to pillar 444. A chalcogenide layer 426 is formed on protective film 416, side spacer 448 and protrusion 446. Electrode material layer 428 at the top is formed on chalcogenide layer 426.

In the above conventional memory cell 420, a bipolar transistor is formed in lower layer 412 extending laterally. Therefore, an area of the bipolar transistor as an access device increases, having resulted in a problem of difficulty in high integration of memory cells constituted of a chalcogenide material.

SUMMARY OF THE INVENTION

The present invention has been made in order to solve the above problem and it is accordingly an object of the present invention to provide a semiconductor memory device capable of achieving high integration.

A semiconductor memory device according to the present invention includes: a semiconductor substrate; a junction transistor formed on the semiconductor substrate; an insulating layer which has a hole accepting at least part of the junction transistor and reaching a surface of the semiconductor substrate, and which is formed on the semiconductor substrate; and a storage element electrically connected to part of the junction transistor provided in the hole. The storage element has a first state in which an electric resistance is relatively high and a second state in which an electric resistance is relatively low. The junction transistor includes: a first conductive type well region formed in said semiconductor substrate; a second conductive type impurity region formed in the first conductive type well region so as to face to the hole; and a first conductive type conductive region provided in the hole so as to be in contact with the second conductive type impurity region.

In the semiconductor memory device, with such a structure, according to the present invention, the junction transistor is connected to the storage element. Therefore, an electrical signal can be sent to the storage element at higher speed compared with a case where a field effect transistor or a diode is connected to the storage element. Furthermore, since at least part of the junction transistor is provided in the hole, an area occupied by the junction transistor on the semiconductor substrate decreases, thereby enabling higher integration.

Preferably, the first state includes an amorphous state and the second state includes a crystalline state. The first state includes an amorphous state and the second state includes a crystalline state. The semiconductor memory device further includes a first heating layer which is provided in the hole so as to interpose between the storage element and the first conductive type conductive region to have an electric resistance higher than that of the first conductive type conductive region, and which heats the storage element. In this case, by feeding a current to the first heating layer, the first heating layer is heated; therefore, enabling heating the storage element in a suitable manner by the heat.

Moreover, preferably, the semiconductor memory device further includes a second heating layer provided so as to isolate from the storage element to preheat the storage element. In this case, since the storage element is preheated by the second heating layer, the storage element can be heated in an instant. The semiconductor memory device further includes the plural junction transistors. The second conductive type impurity region is formed so as to extend in a prescribed direction. Each of the plural junction transistors share the second conductive type impurity region extending in the prescribed direction. In this case, since one second conductive type impurity region is shared by the plural junction transistors, the plural junction transistors can be formed in a narrower region compared with a case where the plural junction transistors have respective second conductive type impurity regions. The semiconductor memory device further includes a wiring layer which extends along the second conductive type impurity region, and which is electrically connected to the second conductive type impurity region. In this case, since the wiring layer is electrically connected to the second conductive type impurity region, reduction can be achieved in amount of a current flowing through the second conductive type impurity region. The semiconductor memory device further includes a second conductive type well region formed in the semiconductor substrate so as to surround the first conductive type well region. In this case, since the second conductive type well region surrounds the first conductive type well region, a potential in the first conductive type well region can be set to a proper value. In addition, the semiconductor memory device further includes a storage region including the plural storage elements and the plural junction transistors electrically connected to each of the plural storage elements. Each of the plural junction transistors include the plural second conductive type impurity regions extending in approximately parallel to each other. The second conductive type impurity regions of odd-numbers counting from the prescribed second conductive type impurity region among the plural second conductive type impurity regions are electrically connected to a first current driving unit provided on one end side of the storage region. The second conductive type impurity regions of even-numbers counting from the prescribed second conductive type impurity region are electrically connected to a second current driving unit provided on another end side of the storage region. In this case, since the odd-numbered second conductive type impurity regions and the even-numbered second conductive type impurity regions are connected to respective different current driving unit, a peripheral portion of the storage region can be compact. As a result, there can be provided a semiconductor memory device capable of achieving high integration.

Furthermore, preferably, the storage element includes: a first ferromagnetic material layer; an insulating layer formed on the first ferromagnetic material layer; and a second ferromagnetic material layer formed on the insulating layer. The first ferromagnetic material layer, the insulating layer and the second ferromagnetic material layer are provided in the hole.

The foregoing and other objects, features, aspects and advantages of the present invention will become more apparent from the following detailed description of the present invention when taken in conjunction with the accompanying drawings.

DESCRIPTION OF PREFERRED EMBODIMENTS

Description will be given of embodiments of the present invention with reference to the accompanying drawings.

First Embodiment

Figure 1:
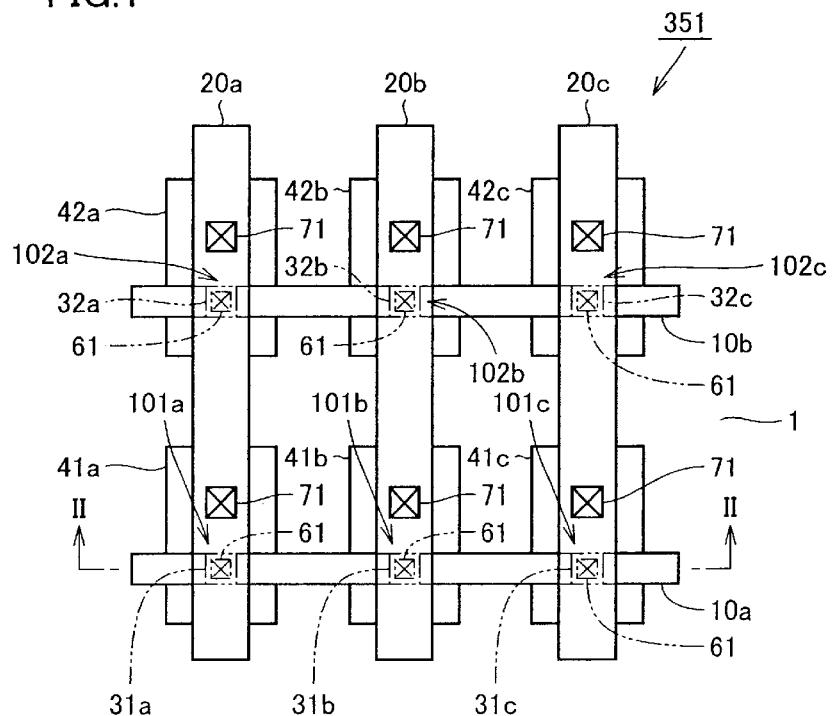
FIG. 1 is a plan view of a semiconductor memory device according to a first embodiment of the present invention.

Referring to FIG. 1, a semiconductor memory device 351 according to the first embodiment of the present invention is provided with: a silicon substrate 1 as a semiconductor substrate; bipolar transistors 101a to 101c and 102a to 102c as junction transistors formed on silicon substrate 1; an interlayer insulating film having contact holes 61 as holes accepting parts of bipolar transistors 101a to 101c and 102a to 102c and reaching a surface of silicon substrate 1; and storage elements 31a to 31c and 32a to 32c provided on the insulating layer so as to be electrically connected to parts of bipolar transistors 101a to 101c and 102a to 102c provided in contact holes 61. Storage elements 31a and 31c and 32a to 32c have a first state (an amorphous state) in which an electrical resistance is relatively high, and a second state (a crystalline state) in which an electrical resistance is relatively low.

N-type impurity regions 41a to 41c and 42a to 42c are formed on silicon substrate 1 as base regions of bipolar transistors 101a to 100c and 102a to 102c. A bit line 101a is formed on n-type impurity regions 41a to 41c. A bit line 10b is formed on n-type impurity regions 42a to 42c. Bit lines 10a and 10b are both constituted of a chalcogenide material (a Ge—Sb—Te based material). Bit lines 10a and 10b extend in parallel to each other. Parts of bit line 10a are storage elements 31a to 31c. Parts of bit line 10b are storage elements 32a to 32c. Storage elements 31a to 31c and 32a to 32c are electrically connected to n-type impurity regions 41a to 41c and 42a to 42c by contact holes 61.

Word lines 20a to 20c extend in a direction intersecting a direction in which bit lines 10a and 10b extend above bit lines 10a and 10b. Word lines 20a to 20c are electrically connected to n-type impurity regions 41a to 41c and 42a to 42c by contact holes 71. Word lines 20a to 20c extend in a direction approximately perpendicular to a direction in which bit lines 10a and 10b.

Bipolar transistors 101a to 101c and 102a to 102c include n-type impurity regions 41a to 41c and 42a to 42c as base regions.

Figure 2:
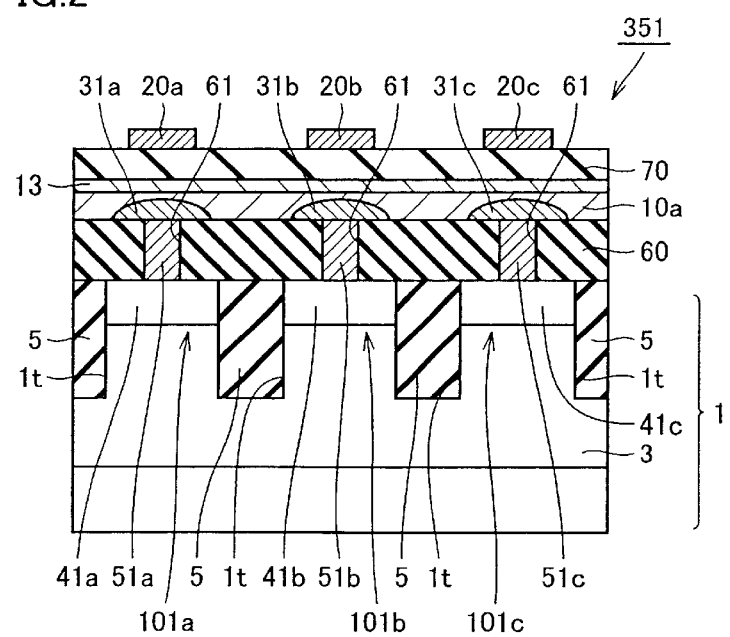
FIG. 2 is a sectional view taken on line II—II of FIG. 1.

Referring to FIG. 2, semiconductor memory device 351 according to the first embodiment of the present invention is provided with: silicon substrate 1 as semiconductor substrate; bipolar transistors 101a to 101c as junction transistors formed on silicon substrate 1; interlayer insulating layer 60 as an insulating layer which has contact holes 61 as holes accepting at least parts of bipolar transistors 101a to 101c and reaching a surface of silicon substrate 1; and storage elements 31a to 31c provided on interlayer insulating layer 60 so as to be electrically connected to parts of bipolar transistors 101a to 101c provided in contact holes 61. Storage elements 31a and 31c have a first state (an amorphous state) in which an electrical resistance is relatively high, and a second state (a crystalline state) in which an electrical resistance is relatively low.

Bipolar transistors 101a to 101c include: a p-type well region 3 as a first conductive type well region formed on silicon substrate 1; n-type impurity regions 41a to 41c as second conductive type impurity regions formed on p-type well region 3 so as to face contact holes 61; and doped polysilicon layers 51a to 51c doped with a p-type impurity as first conductive type conductive regions provided in contact holes 61 so as to be in contact with n-type impurity regions 41a to 41c.

Storage elements 31a to 31c turns into an amorphous state when being heated to a first temperature (a temperature of 600° C. or more) and then being cooled, and turns into a crystalline state when being heated to a second temperature lower than the first temperature (a temperature of less than 600° C.) and then being cooled.

Trenches it are formed on the surface of silicon substrate 1. Trench it is filled with isolation oxide film 5. Neighboring bipolar transistors 101a to 101c are isolated by trenches it. An isolation region can be formed deeper than in a conventional local oxidation scheme (a LOCOS scheme). Thereby, latch-up can be prevented from generating.

P-type well region 3 works as a collector region of bipolar transistors 101a to 100c. N-type impurity regions 41a to 41c are formed between neighboring trenches it so as to be in direct contact with p-type well region 3 as the collector region. N-type impurity regions 41a to 41c serves as base regions of respective bipolar transistors 101a to 101c.

Interlayer insulating film 60 is formed so as to cover the surface of silicon substrate 1. Plural contact holes 61 are provided in interlayer insulating film 60. Contact holes 61 are filled with doped polysilicon layers 51a to 5c. Doped polysilicon layers 51a to 51c serves as emitter regions of bipolar transistors 101a to 101c. Doped polysilicon layers 51a to 51c are doped with a p-type impurity (for example, boron). When current is fed to doped polysilicon layers 51a to 51c, doped polysilicon layers 51a to 51c generate heat. The heat is transferred to storage elements 31a to 31c formed on doped polysilicon layers 51a to 51c. Storage elements 31a to 31c are turn into the amorphous state or the crystalline state by the heat.

Bit line 10a is provided so as to be in contact with plural doped polysilicon layers. Bit line 10a is in direct contact with storage elements 31a to 31c. Bit line 10a and storage elements 31a to 31c are constituted of a chalcogenide material (a Ge—Sb—Te based material). Parts of bit line 10a to which sufficient heat from doped polysilicon layer 51a to 51c is transferred are storage elements 31a to 31c. Metal interconnection layer 13 is provided on the bit line 10a to enhance propagation speed of signals. Metal interconnection layer 13 may not be provided directly on the storage elements 31a to 31c.

Interlayer insulating film 70 is formed so as to cover bit line 1a. Plural word lines 20a to 20c are formed on interlayer insulating film 70 so as to be spaced apart from each other.

Figure 3:
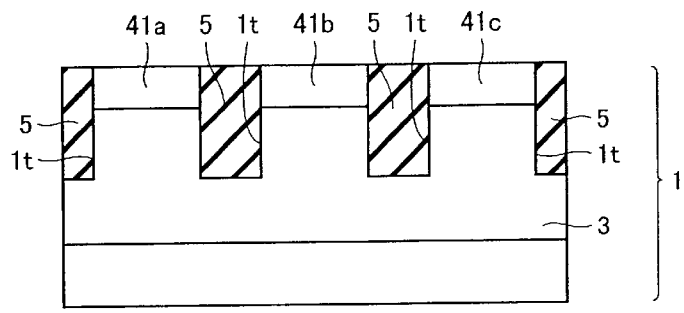
FIGS. 3 and 4 are sectional views showing first and second processes of a fabrication method for a semiconductor device shown in FIG. 2.

Then, description will be given of a fabrication method for the semiconductor memory device shown in FIG. 2. Referring to FIG. 3, first of all, a p-type impurity such as boron is implanted into silicon substrate 1. P-type well region 3 is thereby formed. A resist pattern is formed on the surface of silicon substrate 1. Silicon substrate 1 is etched with the resist pattern as a mask. Trenches it are thereby formed. A silicon oxide film is formed so as to fill trenches it by, for example, CVD (a chemical vapor deposition method). The silicon oxide film is etched back by CMP (a chemical mechanical polishing method) on all the surface thereof to form isolation oxide film 5. By implanting an n-type impurity such as arsenic into the surface of silicon substrate 1, n-type impurity regions 41a to 41c are formed.

Figure 4:
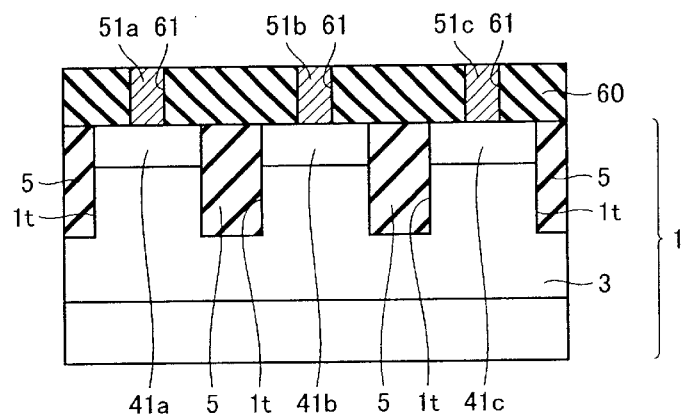

Referring to FIG. 4, interlayer insulating film 60 is formed on silicon substrate 1. A resist pattern is formed on interlayer insulating film 60 to etch interlayer insulating layer 60 according to the resist pattern. By doing so, contact holes 61 reaching n-type impurity regions 41a to 41c are formed. Polysilicon is formed so as to fill contact holes 61 and a p-type impurity such as boron is implanted to the polysilicon. Thereby, doped polysilicon layers 51a to 51c are formed. Note that without limiting to this method, doped silicon layers 51a to 51c doped with an impurity such as boron may be formed by, for example, a CVD method.

Referring to FIG. 2, a chalcogenide material is deposited on interlayer film 60. A resist pattern is formed on the chalcogenide material to etch the chalcogenide material with the resist pattern as a mask. Thereby, bit line 10a is formed. Interlayer insulating film 70 is formed on bit line 10a. A metal layer is formed on interlayer insulating film 70. A resist pattern is formed on the metal layer to etch the metal layer with the resist pattern as a mask. Thereby, word lines 20a to 20c are formed. Note that storage elements 31a to 31c are formed during the course where bit line 10a is formed. That is, parts of bit line 10a that are turned into an amorphous or crystalline state by heating of doped polysilicon layer 51a to 51c serve as storage elements 31a to 31c.

P-type well region 3 is set at ground potential or a negative potential. Preferably, p-type well region 3 is set at a negative potential. When a potential of p-type well region 3 assumes a negative potential in standby, a potential difference between a potential (power supply potential VDD) of n-type impurity regions 41a to 41c as word lines and p-type well region 3 increases. Thereby, the bias is larger than in a case where p-type well region 3 is set at ground potential. When in access, n-type impurity regions 41a to 41c as word lines are set at 0V to increase a potential difference between bit line 10a and p-type well region 3. Thereby, there arises an effect that a current flows with more of ease. Furthermore, in a parasitic npn bipolar formed between neighboring storage elements 31a and 31b as well, the base thereof is p-type well region 3. Since p-type well region 3 is driven to a negative potential, the parasitic npn bipolar transistor is harder to turn on, leading to a preferable result.

In a case where a potential of p-type well region 3 is set to a negative potential, a negative potential is applied to p-type well region before power supply potential (Vdd or Vpp) is applied to word lines 20a to 20c or bit lines 10a to 10e. This is because if a potential of p-type well region 3 is positive, there is a possibility that latch-up occurs. Generally, when power is turned on, there is no knowledge of how potentials in a semiconductor device are distributed. Therefore, a negative potential is at first applied from outside to prevent larch up from occurring. While in the above example, there is shown a case where a negative potential is applied from outside, the negative potential can be produced internally in DRAM (dynamic random access memory) and a flash memory. This time, the latter configuration can be applied, thereby enabling reduction in the number of external power supply pads.

In semiconductor memory device 351 according to the first embodiment of the present invention, bipolar transistors 101a to 101c and 102a to 102c as access devices are connected to storage elements 31a to 31c and 32a to 32c. Therefore, an electrical signal can be transmitted to storage elements 31a to 31c and 32a to 32c in a short time, thereby enabling instant heating. As a result, a crystalline state and an amorphous state can be optimally controlled.

Furthermore, bipolar transistors 101a to 101c and 102a to 102c are of a so-called vertical bipolar type, which are laminated in a vertical direction. Therefore many of bipolar transistors 101a to 101c can be formed in a small area. As a result, a degree of integration of semiconductor memory device 351 can be enhanced.

Note that while in this embodiment, pnp bipolar transistors are shown, npn bipolar transistors may be used as access devices.

Second Embodiment

Figure 5:
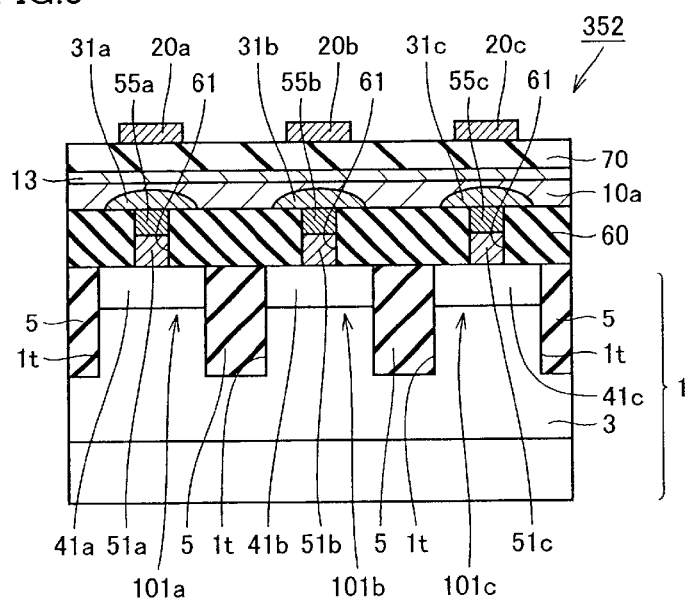
FIG. 5 is a sectional view of a semiconductor memory device according to a second embodiment of the present invention.

Referring to FIG. 5, a semiconductor memory device 352 according to the second embodiment of the present invention is different from semiconductor memory device 351 according to the first embodiment in that low concentration doped polysilicon layers 55a to 55c are formed between doped polysilicon layers 51a to 51c and storage elements 31a to 31c.

That is, semiconductor memory device 352 is further provided with: low concentration doped polysilicon layers 55a to 55c as first heating layers which is provided in contact holes 61 so as to interpose between storage elements 31a to 31c and doped silicon layers 51a to 51c, respectively, as conductive regions of the first conductive type, and which has an electrical resistance higher than that of doped polysilicon layers 51a to 51c.

Low concentration doped polysilicon layers 55a to 55c are constituted of polysilicon doped with a p-type impurity (for example, boron). An impurity concentration of an impurity in low concentration doped polysilicon layers 55a to 55c is lower than that in doped polysilicon layers 51a to 51c. Thus, low concentration doped polysilicon layers 55a to 55c have an electrical resistance higher than that of doped polysilicon layers 51a to 51c.

As a fabrication method for such low concentration doped polysilicon layers 55a to 55c, a CVD method can be employed. That is, after doped polysilicon layers 51a to 51c are formed by the CVD method, doped polysilicon layers 55a to 55c are formed by the CVD method with a reduced doping amount of an impurity in the layers.

Semiconductor memory device 352, with such a structure, according to the second embodiment of the present invention has an effect similar to that of semiconductor memory device 351 according to the first embodiment. Furthermore, since low concentration doped polysilicon layers 55a to 55c as emitter regions have an electrical resistance higher than that of doped polysilicon layers 51a to 51c, a generated heat amount is larger by feeding a current to the former layers. Storage elements 31a to 31c are heated up with certainty by actions of low concentration doped polysilicon layers 55a to 55c.

Third Embodiment

Figure 6:
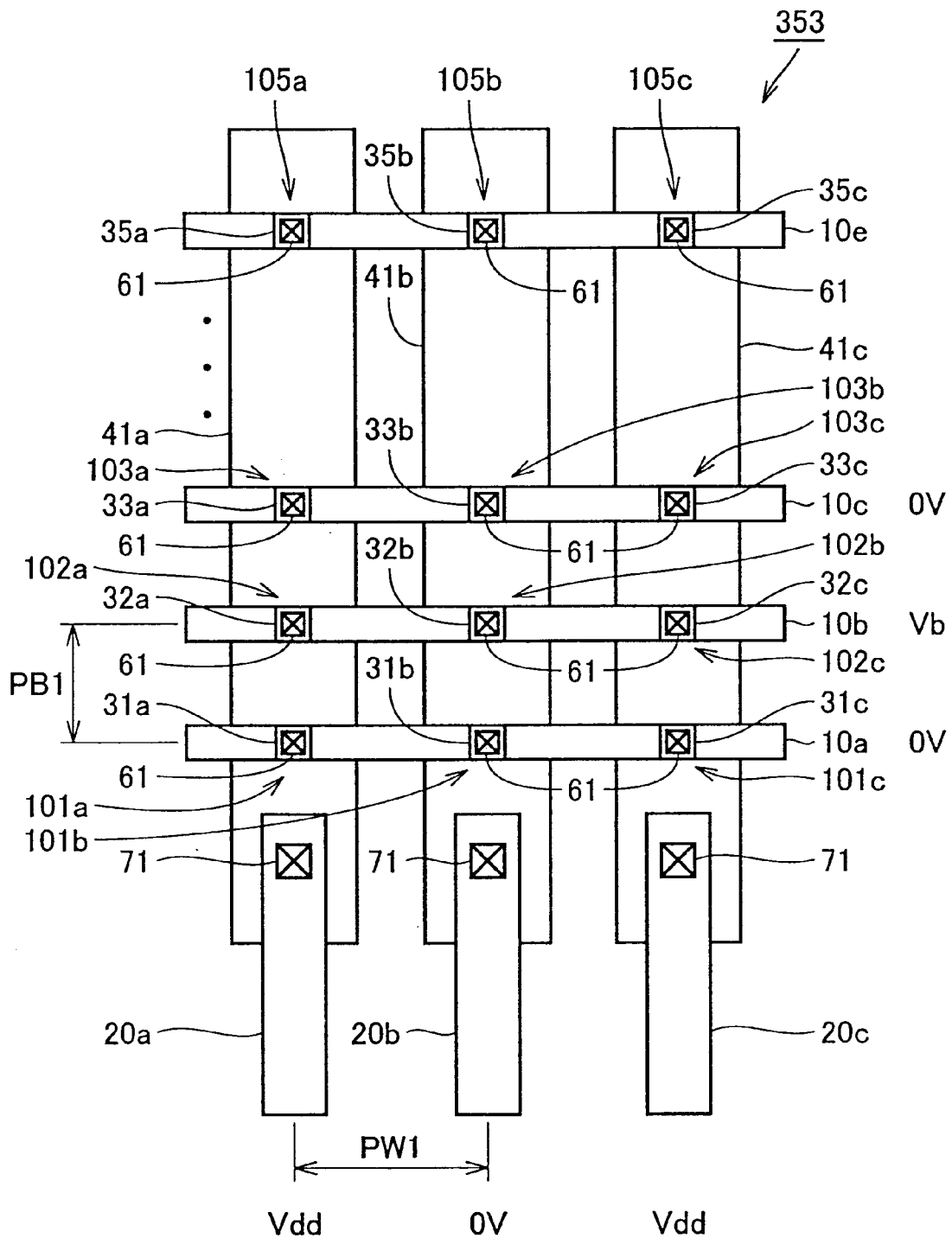
FIG. 6 is a plan view of a semiconductor memory device according to a third embodiment of the present invention.

Referring to FIG. 6, a semiconductor memory device 353 according to the third embodiment of the present invention is different from semiconductor memory device 351 according to the first embodiment in that the device has n-type impurity regions 41a to 41c extending in one direction, and plural bipolar transistors 101a to 105c share n-type impurity regions 41a to 41c.

That is, semiconductor memory device 353 is further provided with plural bipolar transistors 101a to 105c as junction transistors. N-type impurity regions 41a to 41c as second conductive type impurity regions are formed so as to extend in a prescribed direction. Each of plural bipolar transistors 101a to 105c share n-type impurity regions 41a to 41c. More specifically, bipolar transistors 101a, 102a, . . . and 105a share n-type impurity region 41a. Bipolar transistors 101b to 105b share n-type impurity region 41b. Bipolar transistors 101c to 105c share n-type impurity region 41c.

Word lines 20a to 20c are connected to respective n-type impurity regions 41a to 41c. Plural n-type impurity regions 41a to 41c extend in parallel to each other. A spacing between neighboring bit lines is of a constant value of PB1 and a spacing between neighboring word lines is of a constant value of PW1.

When access is performed to storage element 32b as any of the storage elements, a potential of bit line 10b connected storage element 32b is set to Vb (a voltage higher than 0 V), while potentials of other bit lines 10a, 10c, and 10e, which are not selected, are set to 0V. Furthermore, a potential of word line 20b connected to storage element 32b, which is selected, is set to 0V, while potentials of other word lines 20a and 20c, which are connected to non-selected storage elements, are set to Vdd. Bipolar transistor 102b connected to storage element 32b at an intersection between selected bit line 10b and selected word line 20b is turned on to cause a current to feed.

A semiconductor memory device, with such a structure, according to the third embodiment of the present invention has an effect similar to that of a semiconductor memory device according to the first embodiment. Furthermore, since plural bipolar transistors 101a to 105c share n-type impurity regions 41a to 41c, many bipolar transistors 101a to 105c can be placed in a narrow area. In addition, isolation regions decreases compared with the case of the first embodiment, thereby enabling down-sizing of semiconductor memory device 353.

Fourth Embodiment

Figure 7:
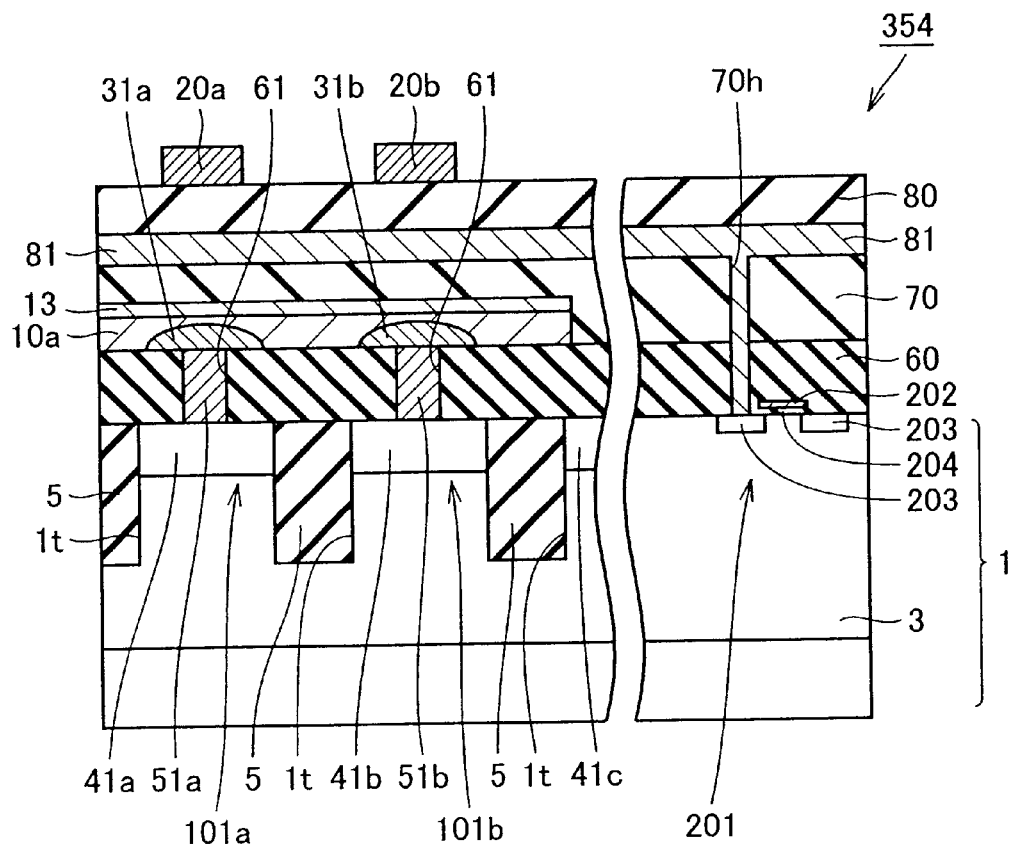
FIG. 7 is a sectional view of a semiconductor device according to a fourth embodiment of the present invention.

Referring to FIG. 7, a semiconductor memory device 354 according to the fourth embodiment of the present invention is different from semiconductor memory device 351 according to the first embodiment in that the device 354 has an auxiliary wiring 81. Auxiliary wiring 81 is electrically connected to a source/drain region 203 of an n-channel transistor 201 formed on interlayer insulating film 70. N-channel transistor 201 has: drain/source regions 203; and a gate electrode 202 formed on silicon substrate 1 with a gate insulating film 204 interposing therebetween. Auxiliary wiring 81 is electrically connected to source/drain region 203 through a contact hole 70h. An interlayer insulating film 80 is formed so as to cover auxiliary wiring 81 and word lines 20a and 20b are formed thereon. Note that in FIG. 7, it is also allowed that word lines 20a and 20b are provided on interlayer insulating film 70 and auxiliary wiring 81 is provided on interlayer insulating film 80.

Figure 8:
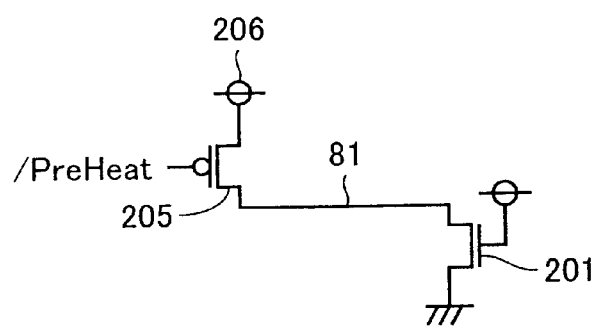
FIG. 8 is a circuit diagram of an auxiliary wiring shown in FIG. 7.

Referring to FIG. 8, auxiliary wiring 81 is connected between n-channel transistor 201 and p-channel transistor 205. P-channel transistor 205 is connected to power supply 206.

In this embodiment, auxiliary wiring 81 is provided above bit line 10a in parallel thereto. One of roles of auxiliary wiring 81 is to preheat an object cell when the cell is heated. This is performed by applying ground potential to the gate electrode of p-channel transistor 205 in a circuit of FIG. 8. When a current is fed from p-channel transistor 205 to n-channel transistor 201 in such a way, heat is produced by Joule heating of electrical resistance in auxiliary wiring 81 and the heat is transferred to storage elements 31a to 31b through interlayer insulating film 70. Thus, storage elements 31a to 31b can be preheated.

As a method for removing heat, a potential of the gate electrode of p-channel transistor 205 is set to VDD. Thereby, a potential of auxiliary wiring 81 turns into ground potential. In this method for removing heat, heat in warm storage elements 31a and 31b are transferred onto auxiliary wiring 81 through interlayer insulating film 70. In solid-state materials, electrons and atoms transfers heat, and electrons transfers heat faster than atoms. This is because electrons can move around freely in a solid mass. Thus, heat in storage elements 31a and 31b is transmitted onto auxiliary wiring 81 through interlayer insulating film 70 to give electrons in auxiliary wiring 81 kinetic energy. Since potentials of electrons in auxiliary wiring 81 are at ground potential, the electrons can be moved around with freedom among sites with the same potential. In such a manner, preheating and removal of heat are enabled with ease.

Fifth Embodiment

Figure 9:
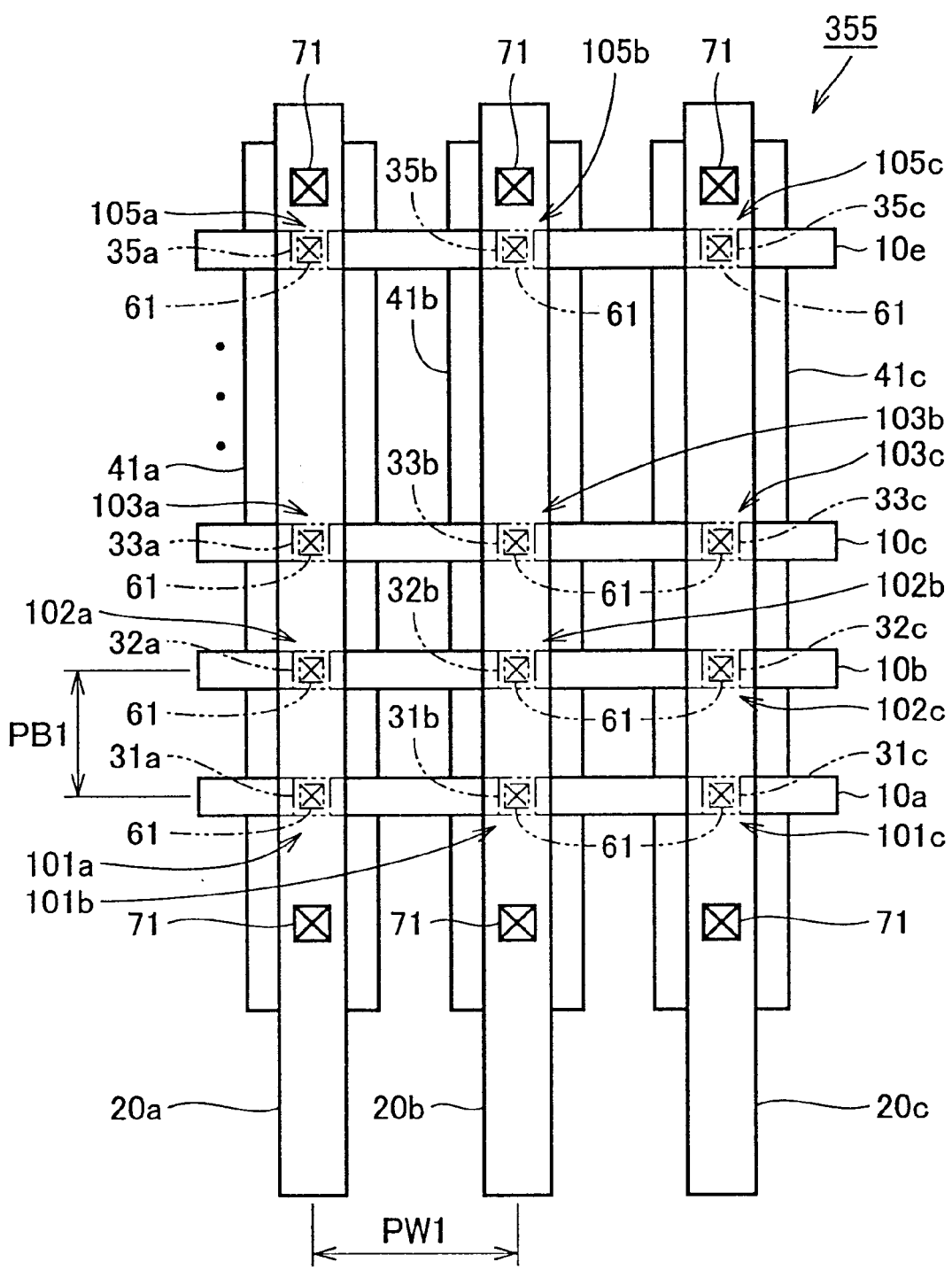
FIG. 9 is a plan view of a semiconductor memory device according to a fifth embodiment of the present invention.

Referring to FIG. 9, a semiconductor memory device 355 according the fifth embodiment of the present invention is different from semiconductor memory device 353 according to third embodiment in that the device 355 has word lines 20a to 20c extending above n-type impurity regions 41a to 41c.

Semiconductor memory device 355 is further provided with word lines 20a to 20c as a wiring layer which extend along n-type impurity regions 41a to 41c and which are electrically connected to n-type impurity regions 41a to 41c.

A semiconductor memory device, with such a structure, according to the fifth embodiment of the present invention has an effect similar to that of a semiconductor memory device according to the third embodiment. Furthermore, there is an effect that the electrical resistance of word lines 20a to 20c reduce an increase in access speed of bipolar transistors 101a to 105c.

Sixth Embodiment

Figure 10:
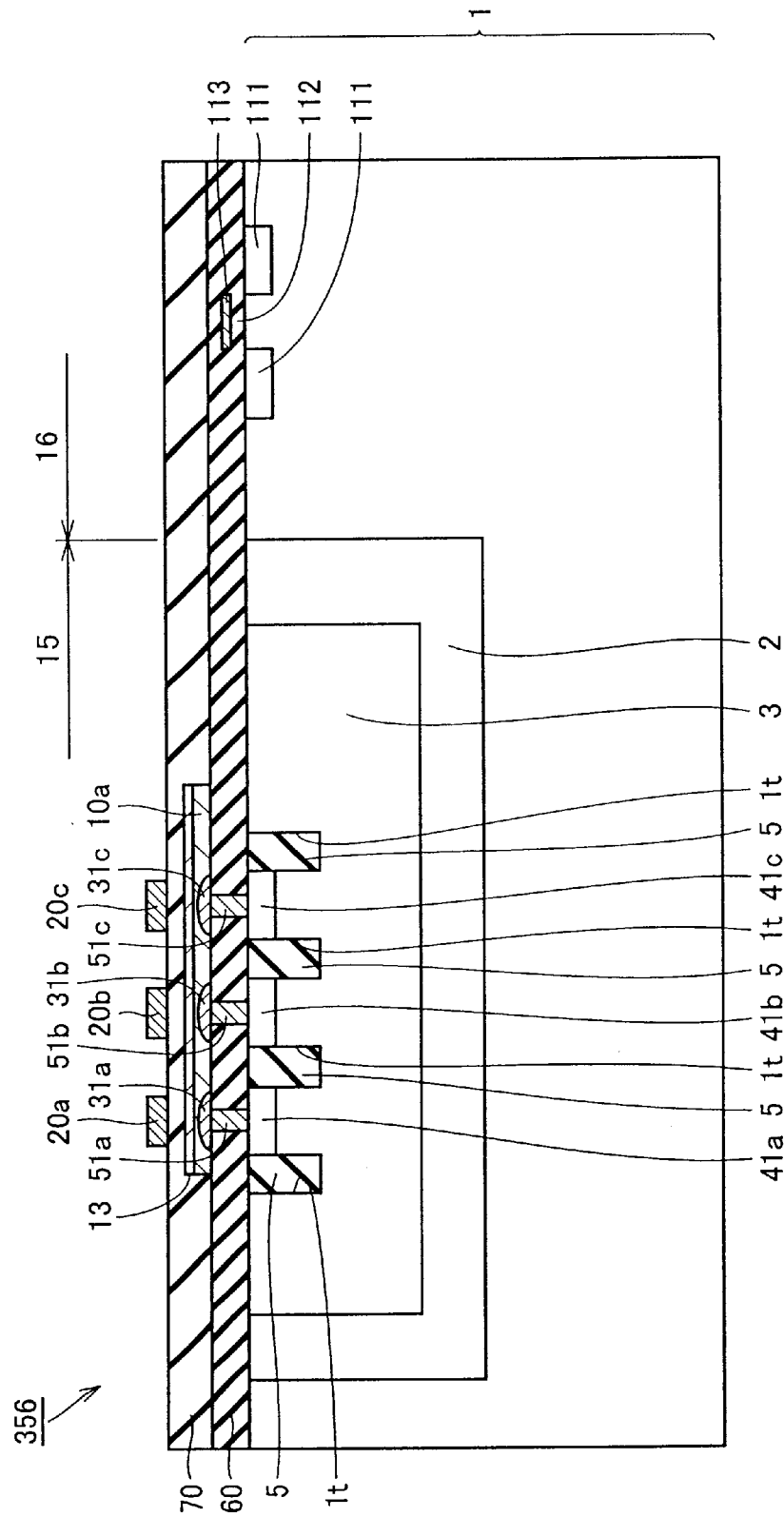
FIG. 10 is a sectional view of a semiconductor memory device according to a sixth embodiment of the present invention.

Referring to FIG. 10, a semiconductor memory device 356 according to the sixth embodiment of the present invention is different from semiconductor memory device 351 according to the first embodiment in that the device 356 has an n-type bottom well region 2 surrounding p-type well region 3. That is, semiconductor memory device 356 is further provided with n-type bottom well region 2 as a second conductive type well region formed in silicon substrate 1 so as to surround p-type well region 3 as a first conductive type well region.

In semiconductor memory device 356, there is a case where a negative potential is applied to storage elements 31a to 31c while a potential of p-type well region of a peripheral region 16 is set to ground potential. An n-type impurity region 111, a gate oxide film 112 and a gate electrode 113 are formed in peripheral region 16. When a negative potential is applied to the backgate of an n-channel transistor, other transistors receive a backgate effect to raise their threshold values and slow the operating speeds. Therefore, it is possible that storage elements 31a to 31c can be surrounded with a so-called triple well to isolate. When storage elements 31a to 31c are surrounded with the triple well as shown in FIG. 10, a potential of storage elements 31a to 31c can be set to any level.

Seventh Embodiment

Figure 11:
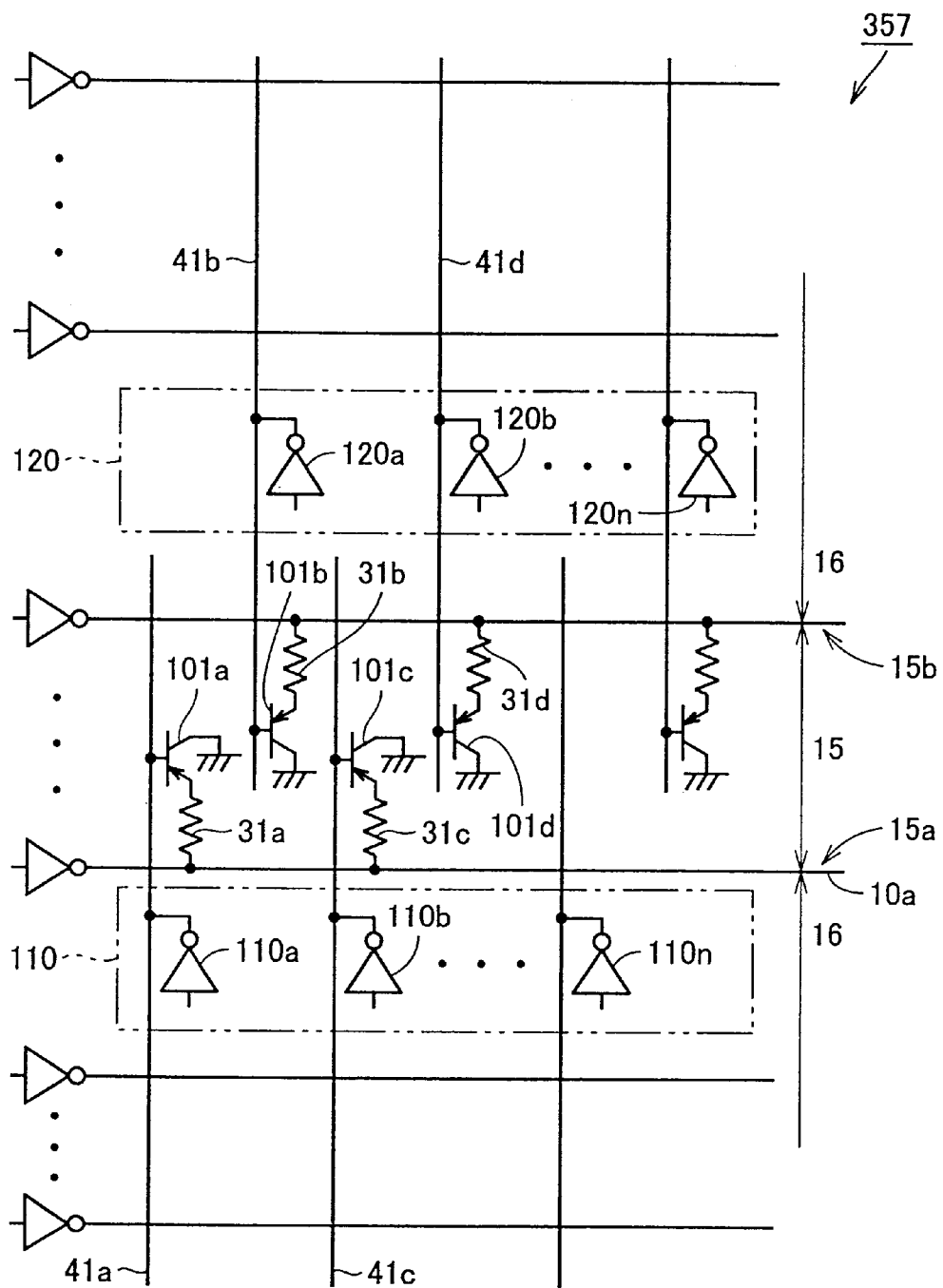
FIG. 11 is a circuit diagram of a semiconductor memory device according to a seventh embodiment of the present invention.

Referring to FIG. 11, a semiconductor memory device 357 according the seventh embodiment of the present invention has a storage region 15 and a peripheral region 16. First current driving unit 110 is provided on one end 15a side of storage region 15. Second current driving unit 120 is provided on another end 15b side of storage region 15.

Plural decoders 110a to 110n constituted of inverters are provided in first current driving unit 110. Plural decoders 120a to 120n constituted of inverters are provided in second current driving unit 120.

Semiconductor memory device 357 is further provided with storage region 15 including: plural storage elements 31a to 31d; and bipolar transistors 101a to 101d as plural junction transistors electrically connected to each of plural storage elements 31a to 31d. Each of plural bipolar transistors 101a to 101c include n-type impurity regions 41a to 41d as second conductive type impurity regions extending in approximately parallel to each other. Among plural n-type impurity regions 41a to 41d as word lines, n-type impurity regions 41a and 41c of odd-numbers counting from a prescribed n-type impurity region 41a are electrically connected to first current driving unit 110 provided on one end 15a side of storage region 15. N-type impurity regions 41b and 41d of even-numbers counting from the prescribed n-type impurity region 41a are electrically connected to second current driving unit 120 provided on another end 15b side of storage region 15.

Figure 12:
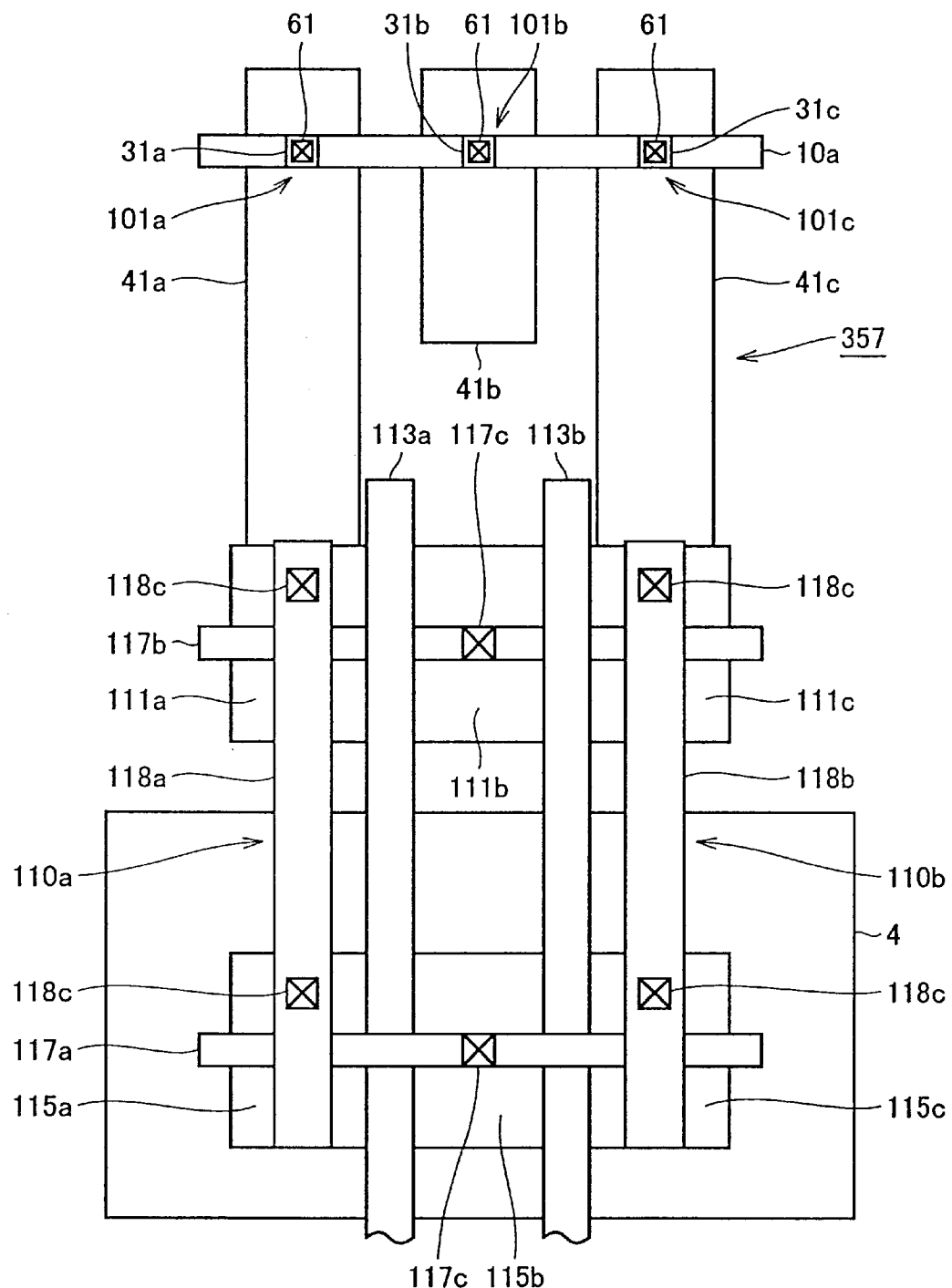
FIG. 12 is a plan view of first current driving unit of FIG. 11.

Referring to FIG. 12, the first current driving unit has decoder 101a and decoder 110b. An n-type well region 4 is formed on the surface of the silicon substrate. A potential of n-type well region 4 is set to Vdd (power supply potential).

P-type impurity regions 115a to 115c are formed in n-type well region 4. Gate electrodes 113a and 113b are formed so as to traverse p-type impurity regions 115a to 115c. P-type impurity regions 115a and 115b are formed on both sides of gate electrode 113a. P-type impurity regions 115b and 115c are formed on both sides of gate electrode 113b.

A wiring 117a is formed so as to be electrically connected to p-type impurity region 115b through a contact hole 117c. A potential of wiring 117a is set to power supply potential.

N-type impurity regions 111a to 111c are formed in p-type well region. N-type impurity regions 111a and 111b are formed on both sides of gate electrode 113a. N-type impurity regions 111b and 111c are formed on both sides of gate electrode 113b. A wiring 117b is formed in n-type region 111b through contact hole 117c. A potential of wiring 117b is set to ground potential.

A wiring 118a electrically connects between n-type impurity region 111a and p-type impurity region 115a. Wiring 118a is electrically connected to n-type impurity region 111a and p-type impurity region 115a through contact hole 118c. A wiring 118b electrically connects between n-type impurity region 111c and p-type impurity region 115c. A wiring 118b is electrically connected to n-type impurity region 111c and p-type impurity region 115c through contact hole 118c. N-type impurity regions 111a and 111c are electrically connected to n-type impurity regions 41a and 41c as word lines. A prescribed potential is applied to gate electrodes 113a and 113d.

In semiconductor memory device 357, with such a structure, according to the seventh embodiment of the present invention, the impurity regions (word lines) of odd-numbers counting from n-type impurity region 41a as a first region, that is first, third, . . . and 2n−1 (wherein n is a natural number) numbered n-type impurity regions are connected to first current driving unit 110 on one end 15a side of storage region 15. On the other hand, the impurity regions of even-numbers, that is 2n numbered n-type impurity regions are connected to second current driving unit 120 on another end 15b side of storage region 15. Therefore, by providing current driving units on respective one and another end sides, a spacing between neighboring ones of n-type impurity regions 41a to 41d can be smaller, which enables high integration in semiconductor memory device. Furthermore, there can be attained an effect similar to that of semiconductor memory device 351 according to the first embodiment.

Eighth Embodiment

Figure 13:
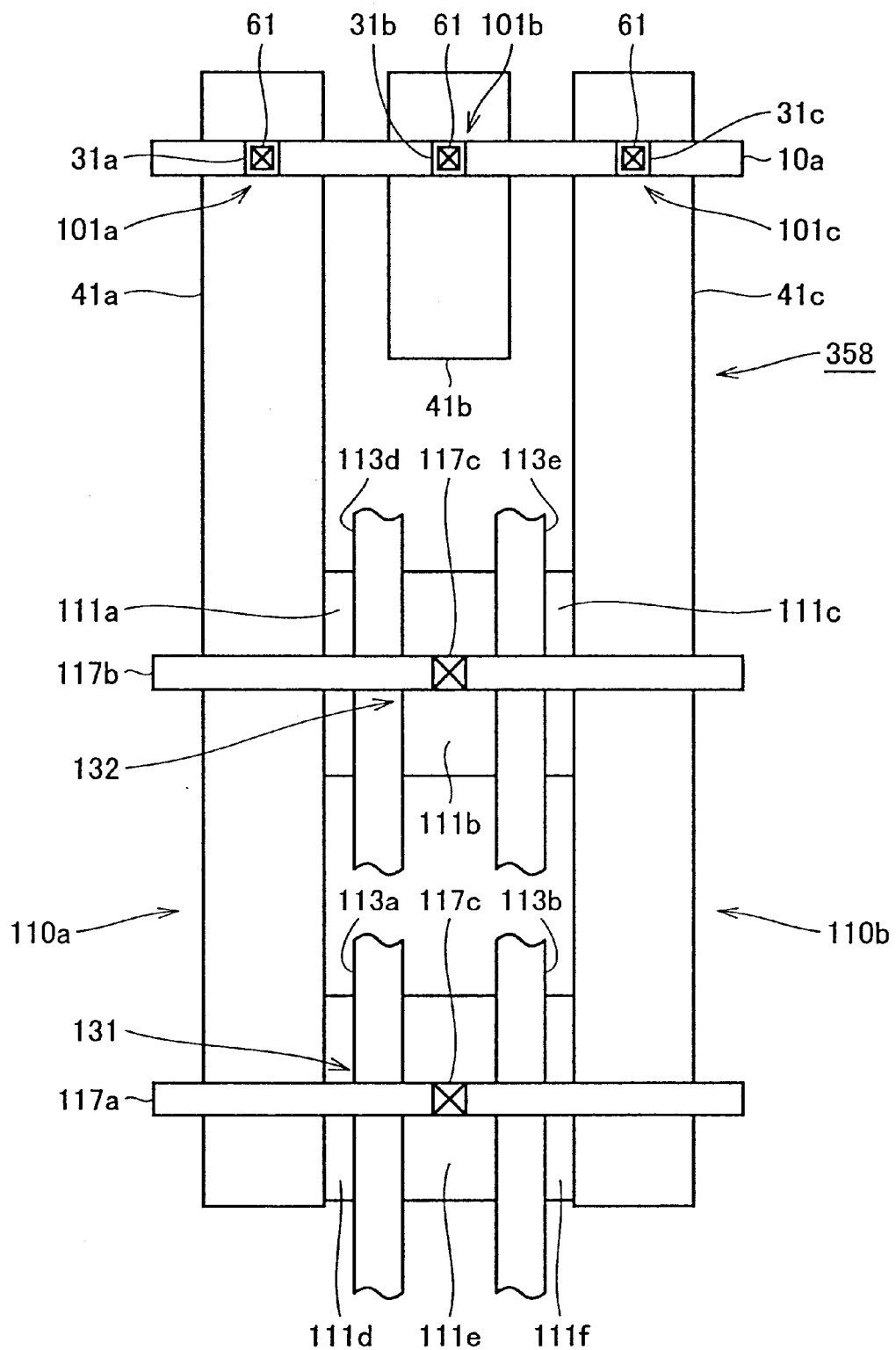
FIG. 13 is a plan view of a semiconductor memory device according to an eighth embodiment of the present invention.

Referring to FIG. 13, a semiconductor memory device 358 according to the eighth embodiment of the present invention is different from semiconductor memory device 357 according to the seventh embodiment in that decoders 110a and 110b are formed with n-channel transistors in the device 358. That is, decoder 110a is provided with two n-channel transistors 131 and 132. N-channel transistor 113 has: gate electrode 113a; and n-type impurity regions 111d and 111e formed on both sides of gate electrode 113. N-channel transistor 132 is provided with: gate electrode 113d and n-type impurity regions 111a and 111b formed on both sides of gate electrode 113d. Note that gate electrodes 113b and 113e constituting a decoder for n-type impurity region 41c as a word line are formed on the silicon substrate. N-type impurity regions 111b, 111c, 111e and 111f are provided on both sides of gate electrodes 113b and 113e.

Figure 14:
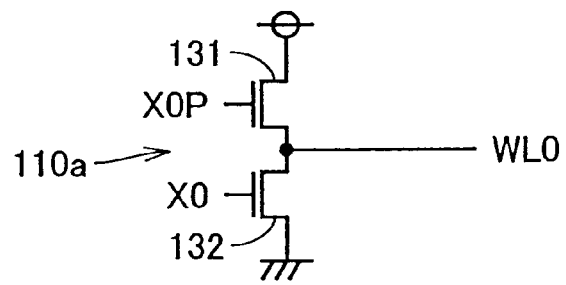
FIG. 14 is a circuit diagram of a decoder shown in FIG. 13.

Referring to FIG. 14, decoder 110a is constituted of two n-channel transistors 131 and 132. Here, in order to select one word line WL0 (n-type impurity region 41a of FIG. 13), two signal X0 and X0P controlling a gate electrode are required.

When n-type impurity region 41a as a word line is selected, a potential of n-type impurity region 41a is set to ground potential. A potential applied to the gate electrode of n-channel transistor 132 is set to VDD (power supply potential) while a potential applied to gate electrode 113a of n-channel transistor 131 is set to 0V.

When n-channel transistor 41a as a word line is not selected, a potential of gate electrode 113a of n-channel transistor 131 is set to Vpp. Potential Vpp is a potential higher than Vdd+Vth. Vth is a threshold voltage of n-channel transistor 131. For example, in a case where Vdd=2.0 V, Vpp=3.4 V. A potential of gate electrode 113d of n-channel transistor 132 is set to 0 V. By doing so, decoder 110a can be constituted of only an n-channel transistor.

In this case, an effect similar to that of the first embodiment is attained. Furthermore, since no p-channel transistor is required, no necessity arises for forming an n-type well for a p-channel transistor. With such a structure, a dramatic reduction is realized in danger of latch-up unique to a CMOS (complementary metal-oxide semiconductor device) circuit. Furthermore, since an isolation space is not required at the boundary between wells, an area for a peripheral region can be reduced as compared with an area required in a case where a driver is constituted of CMOSs.

Figure 15:
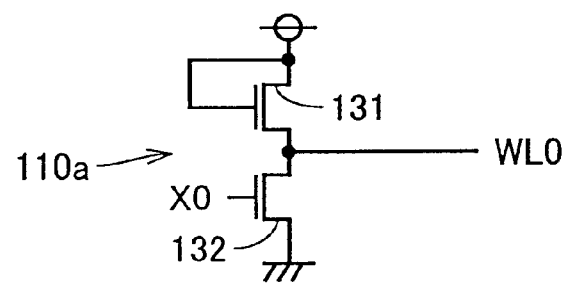
FIG. 15 is a circuit diagram of another decoder.

Referring to FIG. 15, in decoder 101a, signal X0P is deleted and a gate electrode of n-channel transistor 131 is set at power supply potential. In this case, a potential of n-type impurity region 41a as a bit line is precharged to Vcc. Moreover, since a potential of a p-type well region is at 0 V or a negative potential, no operation occurs in a pnp bipolar transistor. By adopting the layout shown in FIG. 15, necessary wirings can be further reduced.

Figure 16:
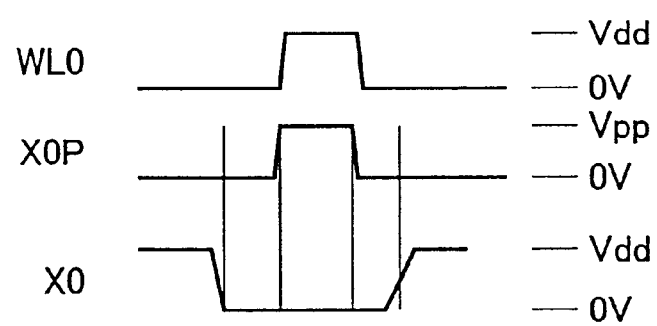
FIG. 16 is a graph showing potentials of the decoder of FIG. 14.

As shown in FIG. 16, when signals X0 and X0P are generated so as not to be overlapped on each other, no chance arises that two n-channel transistors 131 and 132 are simultaneously turned on. As a result, a through current can be reduced.

Ninth Embodiment

Figure 17:
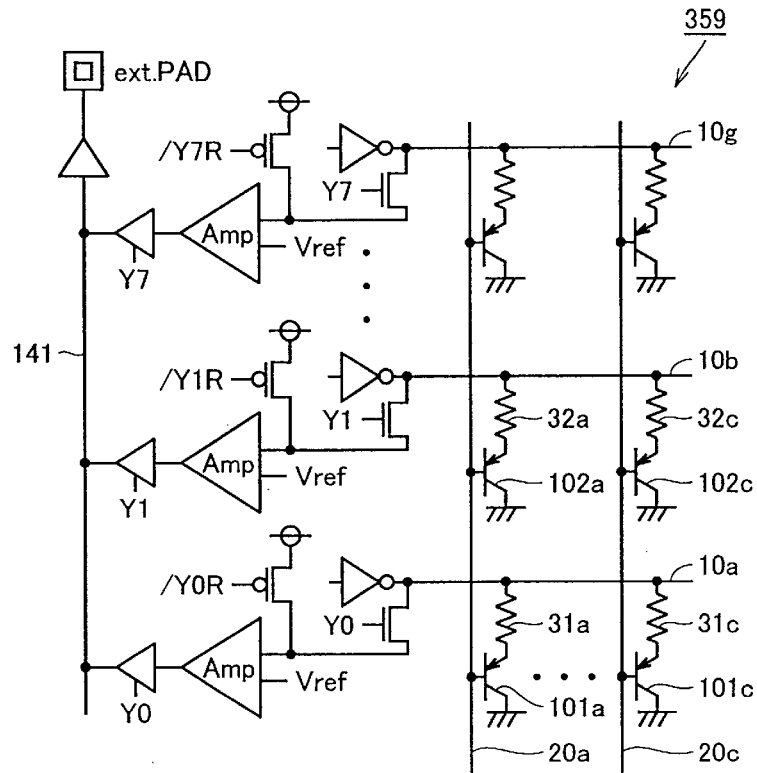
FIG. 17 is a circuit diagram of a semiconductor memory device according to a ninth embodiment of the present invention.

FIG. 17 shows a data bus from a bit line to an input pad. A potential on a bit line is read out with signals Y0, Y1, and Y2 selecting an arbitrary bit line. The potential is compared with a reference voltage Vref. Here, when bit line 10a is selected, signal Y0 turns into a high potential, while signal /Y0R turns into ground potential. In this case, a current is fed into bit line 10a through power supply, a p-channel transistor, an n-channel transistor, pnp bipolar transistor and a p-type well region. While, in this example, signal /Y0R is set at ground potential for simplification, the potential is generally, in more of cases, set to an intermediate level between 0 V and Vdd. A current is fed through a bit line and amplification is performed on a difference in magnitude between a drop in a voltage on the bit line due to a change in resistance value and voltage Vref by an amplifier. Data on selected bit line 10a is buffered and sent out onto data line 141. In this case, data line 141 is shared by bit lines 10a to 10g. An amplitude on data line 141 is finally outputted to an external pad. In implementing of a layout with such a configuration, if a storage region is reduced as described above, difficulty arises in providing amplifiers in place.

Figure 18:
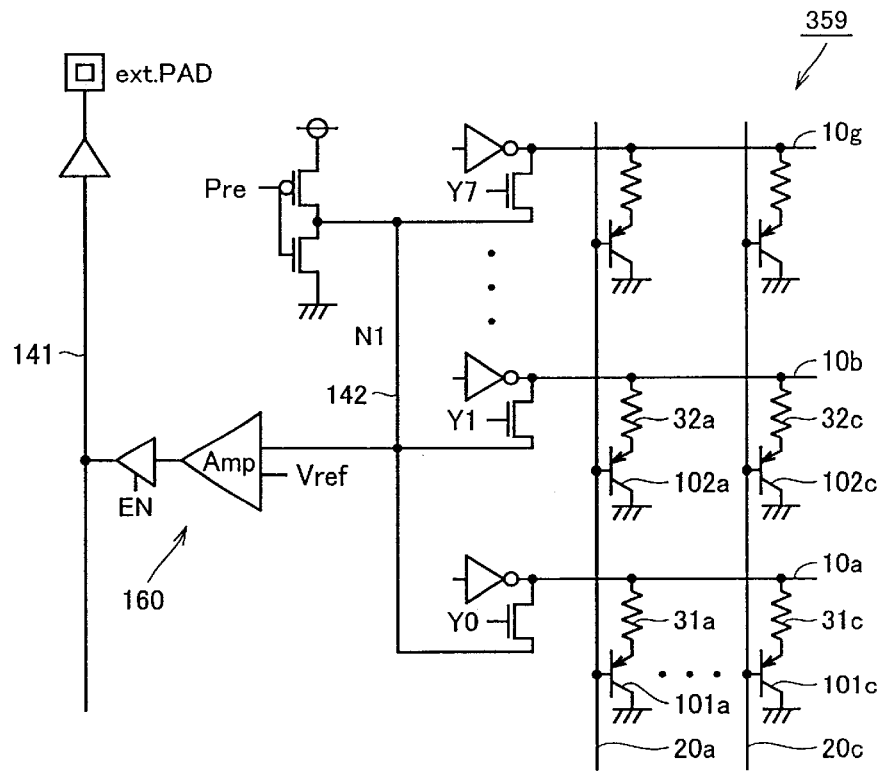
FIG. 18 is a circuit diagram of an improved semiconductor memory device.

Referring to FIG. 18, in an improved semiconductor memory device 359, when one of bit lines 10a to 10g is selected, a potential of an EN signal (an activation signal)

turns into a high state (Vdd), while a potential of Pre signal turns into a low state (Gnd). With such operation, a potential on node 142 shared by signals Y0 to Y7 is at ground potential in standby. When signals Y0 to Y7 are selected, a potential on a selected bit line can be transmitted to an amplifier. Semiconductor memory device 359 has a read circuit 160.

Figure 19:
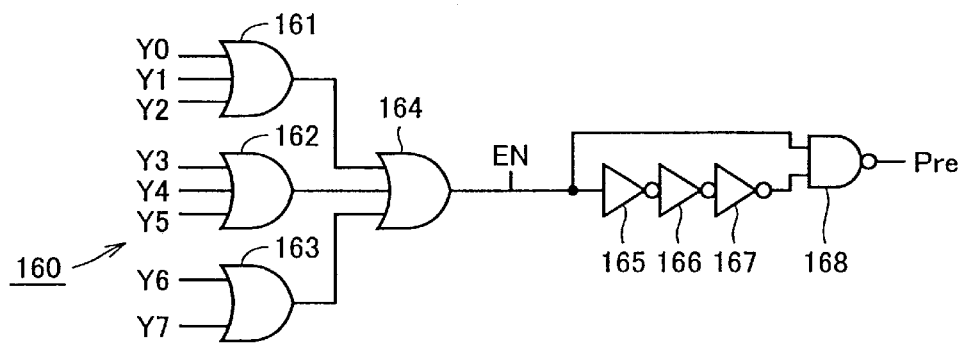
FIG. 19 is a circuit diagram of a read circuit 160 of FIG. 18.

Referring to FIG. 19, read circuit 160 has plural OR gates 161 to 163. OR gates 161 to 163 are connected to another OR gate 164. OR gate 164 is connected to three inverters 165 to 167 and an NOR circuit 168.

In such a semiconductor memory device 359, amplifiers are each shared by bit lines, leading to easy layout of a circuit. As a result, mounting of an LSI (large-scale integrated circuit) can be realized.

Tenth Embodiment

Figure 20:
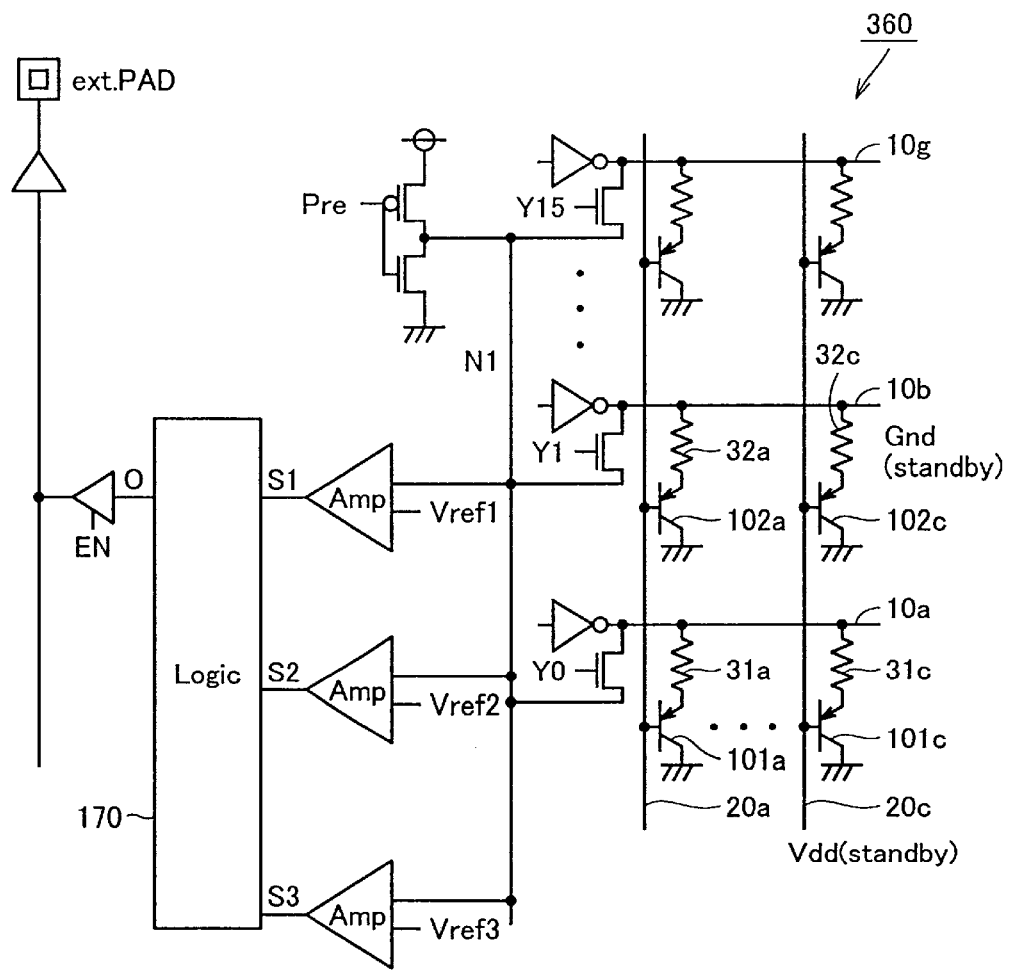
FIG. 20 is a circuit diagram of a semiconductor memory device according to a tenth embodiment of the present invention.

Referring to FIG. 20, a semiconductor memory device 360 according to the tenth embodiment of the present invention is an improvement in semiconductor memory device 359 according to the ninth embodiment. In the mean time, a non-volatile semiconductor memory device using a method for multivalued storage has been known. In a semiconductor memory device according to the present invention as well, multivalued storage is enabled.

Figure 21:
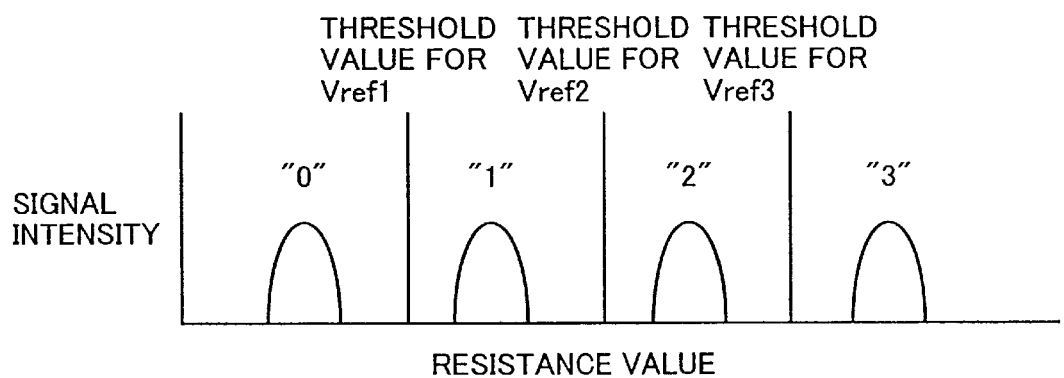
FIG. 21 is a graph showing a concept of multivalued storage.
Figure 22:
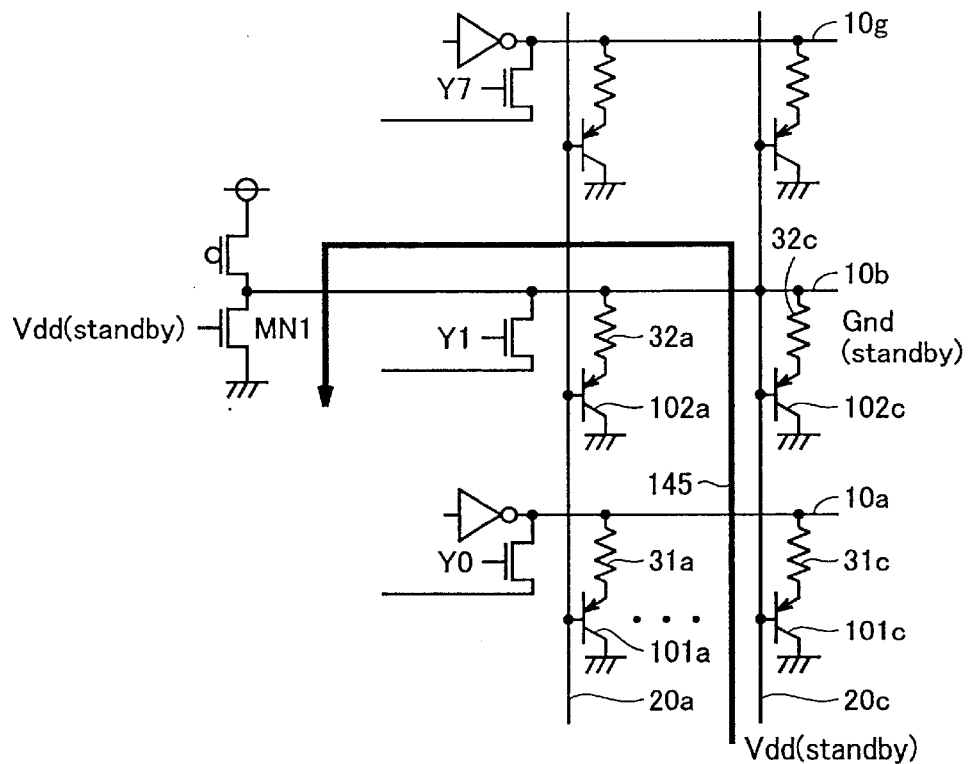
FIG. 22 is a circuit diagram of a semiconductor memory device for describing short-circuit between a word line and a bit line.

Three threshold values are prepared, which are used references shown in FIG. 21. In this embodiment, the three threshold values are Vref1, Vref2 and Vref3. Comparison is performed of each of reduced potentials on bit lines with the three threshold values from Vref1 to Vref3 and results of the comparison are read out. This operation is performed in a block 170 of FIG. 20. The results of the operation are buffered and outputted. With such a configuration adopted, higher density storage can be realized.

Eleventh Embodiment

There is a case where a word line and a bit line are short-circuited therebetween in fabrication of a semiconductor memory device. By the short-circuit, a current is fed in standby. For example, there is a case where short-circuit occurs at an intersection between bit line 10b and word line 20c. Word line 20c is set at power supply potential (Vdd) in standby. On the other hand, a potential on bit line 10b is at ground potential in standby. In such a situation, a current is fed from word line 20c to bit line 10b. The current is fed through an n-channel transistor driving bit line 10b to ground potential in standby. Even if a redundancy circuit is used for a bit line or a word line, a current is fed along the path at all times.

Figure 23:
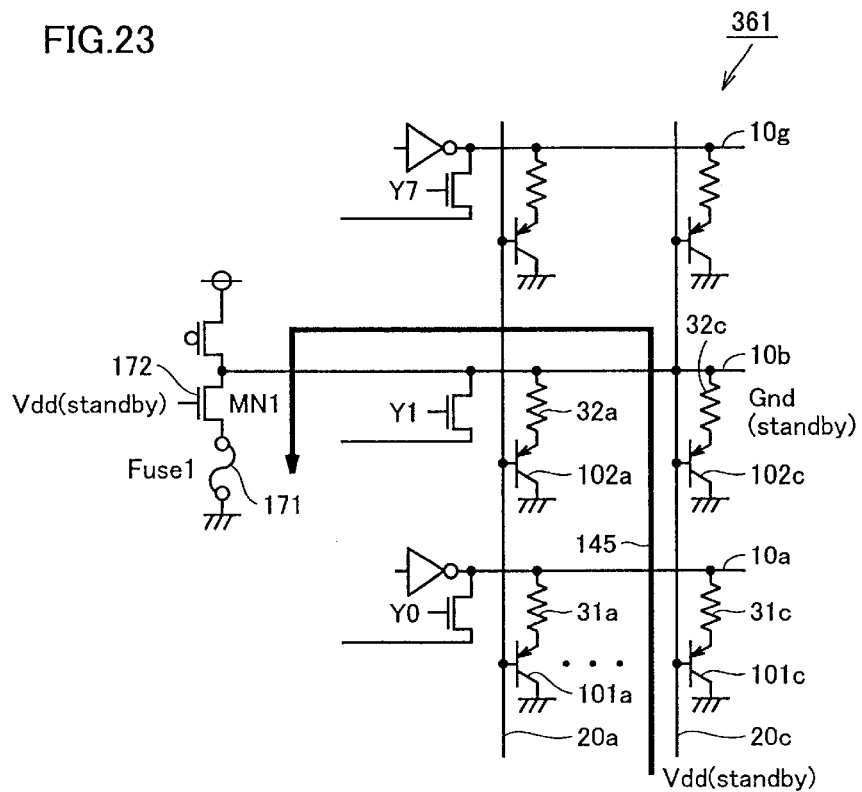
FIG. 23 is a circuit diagram of a semiconductor memory device according to an eleventh embodiment of the present invention.

Referring to FIG. 23, a fuse 171 is provided on a source side of an n-channel transistor 172 (MN1). If word line 20c and bit line 10b are short circuited therebetween, fuse 171 is blown. Thereby, with insulated bit line 10b adopted, the current path can be cut off. Similar to this, fuse 171 may also be provided on a drain side of n-channel transistor 172.

Figure 24:
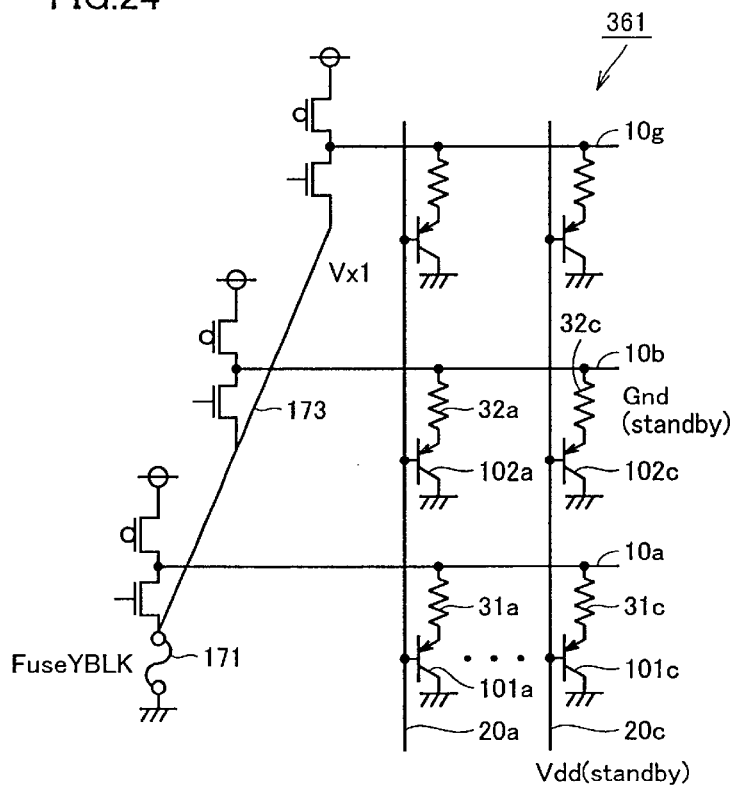
FIG. 24 is a circuit diagram of an improved semiconductor memory device according to the eleventh embodiment of the present invention.

Referring to FIG. 24, in a further improved semiconductor memory device 361 of the present invention, a node 173 (V×1) is used for sharing sources of n-channel transistors on a driver side. Fuse 171 is interposed between node 173 and ground. With such a configuration, fuse 171 can be efficiently arranged in a layout. The fuse 171 may consist of layer fuse or electric fuse.

Twelfth Embodiment

Figure 25:
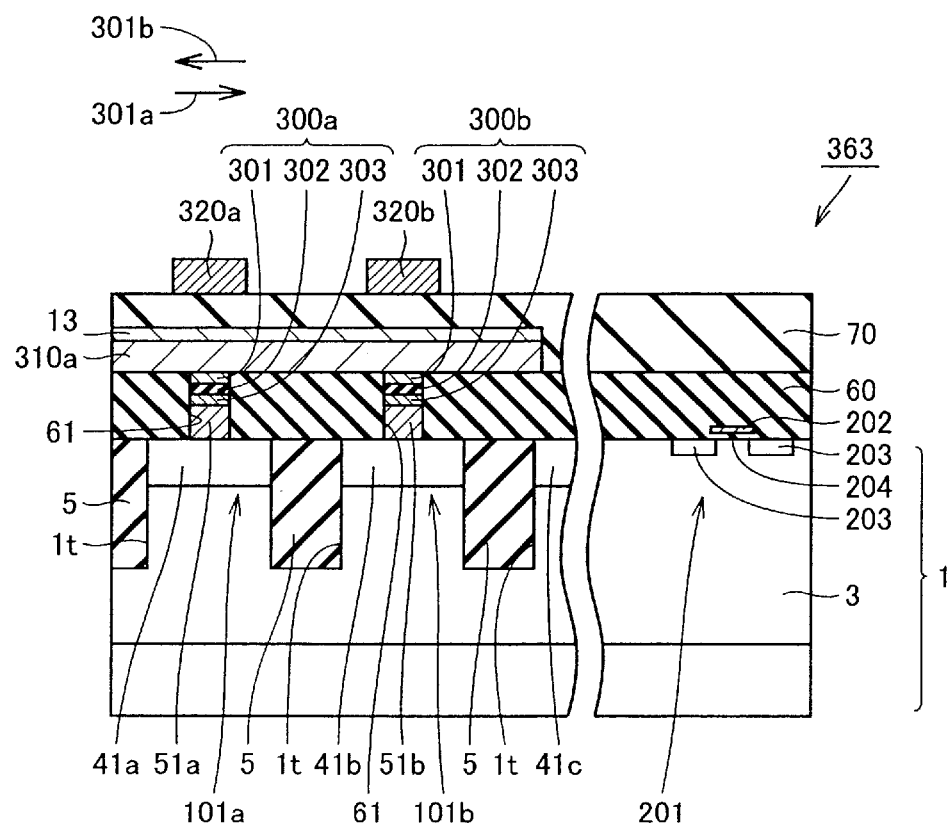
FIG. 25 is a sectional view of a semiconductor memory device according to a twelfth embodiment of the present invention.
Figure 26:
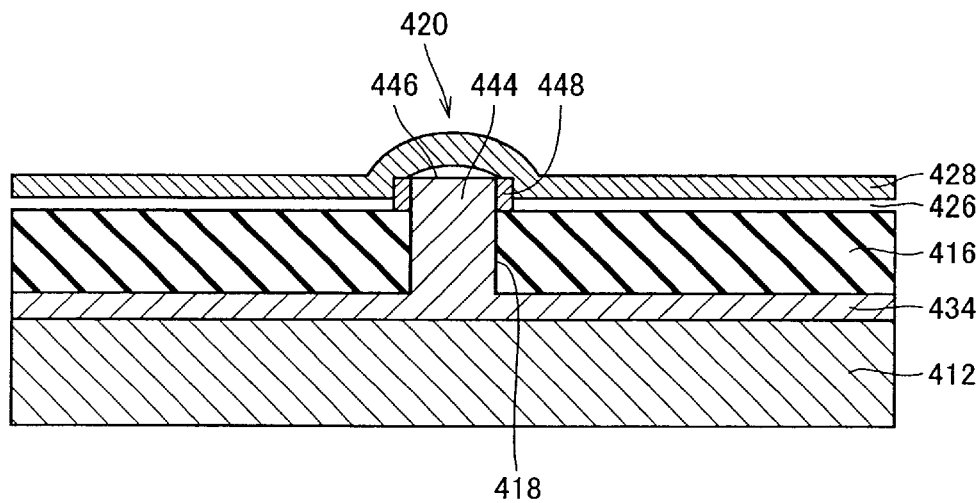
FIG. 26 is a sectional view of a conventional semiconductor memory device.

Referring to FIG. 25, a semiconductor memory device 363 according to the twelfth embodiment of the present invention is a so-called MRAM. Semiconductor memory device 363 is provided with: silicon substrate 1 as a semiconductor substrate; bipolar transistors 101 and 10b as junction transistors formed on silicon substrate 1; interlayer insulating film 60 as an insulating layer which has contact holes 61 as holes accepting parts of bipolar transistors 101a and 101b and reaching a surface of silicon substrate 1; and storage elements 300a and 300b electrically connected to parts of bipolar transistors 101a and 101b provided in contact holes 61. Storage elements 300a and 300b have a first state in which an electrical resistance is relatively high and a second state in which an electrical resistance is relatively low.

Storage elements 300a and 300b are so-called TMR (tunneling magneto resistive) elements, including: a first ferromagnetic material layer 303; an insulating layer 302 formed on first ferromagnetic material layer 303; and a second ferromagnetic material layer 301 formed on insulating layer 302. A direction of a magnetization of first ferromagnetic material layer 303 is fixed at a direction of one of arrow marks 301a and 301b. On the other hand, a direction of a magnetization of second ferromagnetic material layer 301 can be varied between the directions indicated by arrow mark 301a and arrow mark 301b. In order to invert a magnetic field in this case, currents are fed through a bit line 310a, and digit lines 320a and 320b. By applying a synthetic magnetic field of magnetic fields formed by two currents to storage element 300a or 300b, a magnetic field is inverted. By inversion of a magnetic field, data write is performed. Note that when the direction of magnetization of first ferromagnetic material layer 303 and the direction of magnetization of second ferromagnetic layer 301 are the same as each other, an electrical resistance of storage element 300a decreases. In a case where the direction of magnetization of first ferromagnetic material layer 303 and the direction of magnetization of second ferromagnetic layer 301 are opposite each other (in antiparallel), electrical resistance of storage elements 300a and 300b increase.

In data read operation, currents are fed through word lines constituted of n-type impurity regions 41a and 41b. Furthermore, a current is fed from bit line 310a. Since a resistance of storage element 300a changes according to whether a direction of magnetization of first ferromagnetic layer 303 and a direction magnetization of second ferromagnetic material 301 are the same as each other or opposite each other, the presence or absence of information can be determined by reading out the current therein. The following determination is similar to those in the above embodiments.

In a semiconductor memory device, with such a structure, according to the present invention has an effect similar to that of a semiconductor memory device according to the first embodiment.

According to the present invention as described above, there can be provided a semiconductor memory device with storage elements placed at a high density in the chip thereof. The above embodiments can also be applied to a device with a logic integrated memory such as an embedded memory and SOC (system on silicon) without limiting to a semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
a semiconductor substrate;
a junction transistor formed on said semiconductor substrate;
an insulating layer formed on said semiconductor substrate, said insulating layer having a hole accepting at least part of said junction transistor and reaching a surface of said semiconductor substrate; and
a storage element electrically connected to part of said junction transistor provided in said hole, wherein
said storage element has a first state in which an electric resistance is relatively high and a second state in which an electric resistance is relatively low, and
said junction transistor includes a first conductive type crystal well region formed in said semiconductor substrate, a second conductive type impurity region formed in said first conductive type well region so as to face to said hole, and a first conductive type conductive region filled in said hole so as to be in contact with said second conductive type impurity region.

2. The semiconductor memory device according to claim 1, wherein said first state includes an amorphous state and said second state includes a crystalline state.

3. The semiconductor memory device according to claim 1, further comprising a first heating layer which is provided in said hole so as to interpose between said storage element and said first conductive type conductive region to have an electric resistance higher than that of said first conductive type conductive region, and which heats said storage element.

4. The semiconductor memory device according to claim 1, further comprising a second heating layer provided so as to isolate from said storage element to preheat said storage element.

5. The semiconductor memory device according to claim 1, further comprising said plural junction transistors, wherein said second conductive type impurity region is formed so as to extend in a prescribed direction, and each of said plural junction transistors share said second conductive type impurity region extending in the prescribed direction.

6. The semiconductor memory device according to claim 5, further comprising a wiring layer which extends along said second conductive type impurity region, and which is electrically connected to said second conductive type impurity region.

7. The semiconductor memory device according to claim 1, further comprising a second conductive type well region formed in said semiconductor substrate so as to surround said first conductive type well region.

8. The semiconductor memory device according to claim 1, further comprising a storage region including said plural storage elements and said plural junction transistors electrically connected to each of said plural storage elements, wherein
each of said plural junction transistors include said plural second conductive type impurity regions extending in approximately parallel to each other, said second conductive type impurity regions of odd-numbers counting from said prescribed second conductive type impurity region among said plural second conductive type impurity regions are electrically connected to a first current driving means provided on one end side of said storage region, and said second conductive type impurity regions of even-numbers counting from said prescribed second conductive type impurity region are electrically connected to a second current driving means provided on another end side of said storage region.

9. The semiconductor memory device according to claim 1, wherein said storage element includes: a first ferromagnetic material layer; an insulating layer formed on the first ferromagnetic material layer; and a second ferromagnetic material layer formed on the insulating layer.

10. The semiconductor memory device according to claim 9, wherein said first ferromagnetic material layer, said insulating layer and said second ferromagnetic material layer are provided in said hole.

* * * * *

UNITED STATES PATENT AND TRADEMARK OFFICE
CERTIFICATE OF CORRECTION

PATENT NO. : 6,597,031 B2
DATED : July 22, 2003
INVENTOR(S) : Shigehiro Kuge

It is certified that error appears in the above-identified patent and that said Letters Patent is hereby corrected as shown below:

<u>Title page,</u>
Item [75], Inventor, change "Shigehio" to -- Shigehiro --

Signed and Sealed this

Eleventh Day of November, 2003

JAMES E. ROGAN
*Director of the United States Patent and Trademark Office*